(12) United States Patent
Kim et al.

(10) Patent No.: US 9,812,539 B2
(45) Date of Patent: Nov. 7, 2017

(54) SEMICONDUCTOR DEVICES HAVING BURIED CONTACT STRUCTURES

(71) Applicant: Samsung Electronics Co., Ltd., Suwon-si, Gyeonggi-do (KR)

(72) Inventors: Yong-Jun Kim, Suwon-si (KR); Sung-In Kim, Hwaseong-si (KR); Jung-Woo Song, Hwaseong-si (KR); Jae-Rok Kahng, Seoul (KR); Dae-Won Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/962,003

(22) Filed: Dec. 8, 2015

(65) Prior Publication Data

US 2016/0181385 A1    Jun. 23, 2016

(30) Foreign Application Priority Data

Dec. 17, 2014  (KR) .......................... 10-2014-0181943

(51) Int. Cl.
*H01L 29/423* (2006.01)
*H01L 27/108* (2006.01)
(Continued)

(52) U.S. Cl.
CPC ........ *H01L 29/4236* (2013.01); *H01L 21/743* (2013.01); *H01L 21/76897* (2013.01);
(Continued)

(58) Field of Classification Search
CPC ........... H01L 29/4236; H01L 29/66621; H01L 45/1253; H01L 21/76895; H01L 43/10;
(Continued)

(56) References Cited

U.S. PATENT DOCUMENTS 7,679,137 B2    3/2010  Lee et al.
7,825,464 B2    11/2010  Cho
(Continued)

FOREIGN PATENT DOCUMENTS

JP      2012-079931     4/2012
KR      1993-0015012    7/1993
(Continued)

*Primary Examiner* — Cuong Q Nguyen
*Assistant Examiner* — Nishath Yasmeen
(74) *Attorney, Agent, or Firm* — Ward and Smith, P.A.

(57) ABSTRACT

Semiconductor devices are provided including a substrate defining a gate trench. A buried gate structure is provided in the gate trench and at least fills the gate trench. The buried gate structure includes a gate insulation layer pattern, a gate electrode and a capping layer pattern. First and second impurity regions are provided at portions of the substrate adjacent to the buried gate structure, respectively. At least a portion of each of the first and second impurity regions face a sidewall of the buried gate structure. First and second buried contact structures are provided on the first and second impurity regions, respectively. Each of the first and second buried contact structures includes a metal silicide pattern and a metal pattern, and at least a portion of each of the first and second buried contact structures face to a sidewall of the buried gate structure.

9 Claims, 15 Drawing Sheets

(51) Int. Cl.
*H01L 27/24* (2006.01)
*H01L 29/66* (2006.01)
*H01L 21/768* (2006.01)
*H01L 21/74* (2006.01)
*H01L 27/22* (2006.01)
*H01L 43/08* (2006.01)
*H01L 45/00* (2006.01)
*H01L 21/285* (2006.01)

(52) U.S. Cl.
CPC .. *H01L 27/10814* (2013.01); *H01L 27/10823* (2013.01); *H01L 27/10876* (2013.01); *H01L 27/228* (2013.01); *H01L 27/2436* (2013.01); *H01L 29/66621* (2013.01); *H01L 21/28518* (2013.01); *H01L 27/10855* (2013.01); *H01L 27/10888* (2013.01); *H01L 43/08* (2013.01); *H01L 45/06* (2013.01); *H01L 45/08* (2013.01); *H01L 45/1233* (2013.01); *H01L 45/144* (2013.01)

(58) Field of Classification Search
CPC . H01L 27/10823; H01L 43/08; H01L 45/145; H01L 27/2436; H01L 45/141; H01L 45/16; H01L 43/02; H01L 45/06; H01L 27/10876; H01L 45/08; H01L 43/12; H01L 27/10814
See application file for complete search history.

(56) References Cited

U.S. PATENT DOCUMENTS

| | | | |
|---|---|---|---|
| 8,623,727 | B2 | 1/2014 | Shin et al. |
| 2005/0133836 | A1* | 6/2005 | Seo ............... H01L 29/4236 257/288 |
| 2006/0097314 | A1* | 5/2006 | Uchiyama ...... H01L 21/28061 257/330 |
| 2008/0211057 | A1 | 9/2008 | Lee et al. |
| 2011/0256678 | A1 | 10/2011 | Kim |
| 2011/0260288 | A1* | 10/2011 | Sukekawa ...... H01L 21/76897 257/532 |
| 2011/0303887 | A1* | 12/2011 | Otsuka ............ H01L 27/2436 257/1 |
| 2013/0043519 | A1 | 2/2013 | Moon et al. |

FOREIGN PATENT DOCUMENTS

| | | |
|---|---|---|
| KR | 10-2005-0034292 A | 4/2005 |
| KR | 10-0855967 | 9/2008 |
| KR | 10-2011-0105168 A | 9/2011 |
| KR | 10-1139464 | 5/2012 |
| KR | 10-1194872 | 10/2012 |
| KR | 10-2013-0020417 A | 2/2013 |
| KR | 10-2014-0083747 A | 7/2014 |
| KR | 10-2014-0086647 A | 7/2014 |

\* cited by examiner

SEMICONDUCTOR DEVICES HAVING BURIED CONTACT STRUCTURES

CROSS-REFERENCE TO RELATED APPLICATION

This application claims priority under 35 USC §119 to Korean Patent Application No. 10-2014-0181943, filed Dec. 17, 2014 in the Korean Intellectual Property Office (KIPO), the contents of which are hereby incorporated herein by reference as if set forth in its entirety.

FIELD

The present inventive concept generally relates to semiconductor devices and, more particularly, to semiconductor devices including a transistor having a buried gate structure and related methods.

BACKGROUND

In a highly integrated semiconductor device, a buried channel array transistor (BCAT) including a buried gate structure in a gate trench of a substrate may be formed. In BCATs including a buried gate structure, a channel length may decrease causing on-state currents. In order to reduce the channel length, depths of the source/drain regions are increased and, thus a resistance of each of source/drain regions, i.e., a spreading resistance, may also be increased. Therefore, a high-performance transistor having a reduced spreading resistance is desired.

SUMMARY

Some embodiments of the present inventive concept provide semiconductor devices including a substrate defining a gate trench therein. A buried gate structure is provided in the gate trench and at least fills the gate trench. The buried gate structure includes a gate insulation layer pattern, a gate electrode and a capping layer pattern. First and second impurity regions are provided at portions of the substrate adjacent to the buried gate structure, respectively. At least a portion of each of the first and second impurity regions face a sidewall of the buried gate structure. First and second buried contact structures are provided on the first and second impurity regions, respectively. Each of the first and second buried contact structures include a metal silicide pattern and a metal pattern, and at least a portion of each of the first and second buried contact structures face to a sidewall of the buried gate structure.

In further embodiments, the buried gate structure may protrude from a top portion of the gate trench, In still further embodiments, top surfaces of the first and second impurity regions may be lower than that of the gate electrode.

In some embodiments, bottoms of the first and second impurity regions may be lower than a central portion of the gate electrode corresponding to about ½ of a height of the gate electrode.

In further embodiments, top surfaces of the first and second buried contact structures may be substantially coplanar with a top surface of the buried gate structure.

In still further embodiments, the metal silicide pattern may directly contact each of the first and second impurity regions.

In some embodiments, a bottom of the metal silicide pattern may be lower than a top surface of the gate electrode.

In further embodiments, the metal silicide pattern may include at least one selected from the group consisting of cobalt silicide, nickel silicide, titanium silicide, tantalum silicide, molybdenum silicide, and tungsten silicide.

In still further embodiments, the semiconductor device may further include an isolation layer on the substrate, and a top surface of the isolation layer may be substantially coplanar with those of the first and second buried contact structures.

In some embodiments, the semiconductor device may further include a first contact plug on the first buried contact structure, a second contact plug on the second buried contact structure, a bit line electrically connected to the first contact plug, and a capacitor on the second contact plug.

In further embodiments, the semiconductor device may further include a source line on the first buried contact structure, a contact plug on the second buried contact structure, a variable resistance structure electrically connected to the contact plug and a bit line on the variable resistance structure.

Still further embodiments of the present inventive concept provided methods of manufacturing a semiconductor device including etching a substrate to define a gate trench. A buried gate structure is formed in the gate trench and at least fills the gate trench. The buried gate structure includes a gate insulation layer pattern, a gate electrode and a capping layer pattern. First and second impurity regions are formed at portions of the substrate adjacent to the buried gate structure, respectively. At least a portion of each of the first and second impurity regions face to a sidewall of the buried gate structure. First and second buried contact structures are formed on the first and second regions, respectively. Each of the first and second buried contact structures includes a metal silicide pattern and a metal pattern, and at least a portion of each of the first and second buried contact structures face to a sidewall of the buried gate structure.

In some embodiments, the buried gate structure may protrude from a top portion of the gate trench, In further embodiments, when the buried gate structure is formed, after forming the gate structure, a portion of the substrate adjacent to the sidewall of the buried gate structure may be partially etched to form a recess having a bottom lower than a top surface of the gate electrode.

In still further embodiments, after forming the first and second buried contact structures, a first contact plug may be formed on the first buried contact structure. A second contact plug may be formed on the second buried contact structure. A bit line may be formed to be electrically connected to the first contact plug. A capacitor may be formed on the second contact plug.

In some embodiments, the first buried contact structure and the first contact plug may be formed by a first deposition process, and the second buried contact structure and the second contact plug may be formed by a second deposition process.

In further embodiments, after forming the first and second buried contact structures, a source line may be formed on the first buried contact structure. A contact plug may be formed on the second buried contact structure. A variable resistance structure may be formed to be electrically connected to the contact plug. A bit line may be formed on the variable resistance structure.

Still further embodiments provide methods of forming a semiconductor device, the method including forming a buried gate structure in a gate trench defined by a substrate; forming first and second impurity regions spaced apart by the buried gate structure; and forming first and second buried contact structures on the first and second impurity regions, respectively, each of the first and second buried contact structures including a metal silicide pattern and a metal pattern, such that a portion of the substrate adjacent the first and second impurity regions is replaced with the metal pattern.

In some embodiments, the first and second buried contact structures may be formed having top surfaces that are substantially coplanar with a top surface of the buried gate structure.

In further embodiments, the metal silicide patterns of the first and second contact structures may directly contact the first and second impurity regions, respectively.

BRIEF DESCRIPTION OF THE DRAWINGS

Example embodiments will be more clearly understood from the following detailed description taken in conjunction with the accompanying drawings.

FIG. 1 is a cross-section illustrating a semiconductor device in accordance with some embodiments of the present inventive concept.

FIG. 2 is a cross-section illustrating a transistor of the semiconductor device in FIG. 1 in accordance with some embodiments of the present inventive concept.

FIGS. 3 to 12 are cross-sections illustrating processing steps in the fabrication of the semiconductor device in FIG. 1 in accordance with some embodiments of the present inventive concept.

FIGS. 13 to 19 are cross-sections illustrating processing steps in the fabrication of the semiconductor device in FIG. 1 in accordance with some embodiments of the present inventive concept.

FIGS. 20 to 24 are cross-sections illustrating processing steps in the fabrication of the semiconductor device in FIG. 1 in accordance with some embodiments.

FIG. 25 is a cross-section illustrating a semiconductor device in accordance with some embodiments of the present inventive concept.

FIGS. 26 and 27 are cross-sections illustrating processing steps in the fabrication of the semiconductor device in FIG. 25 in accordance with some embodiments.

DETAILED DESCRIPTION

Figure 1:
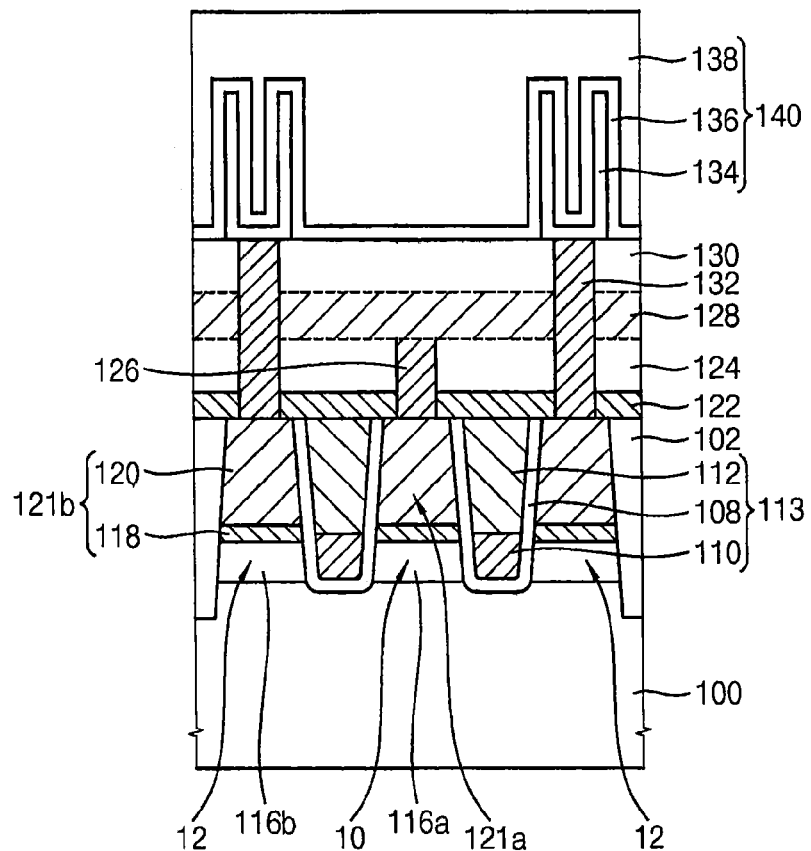
FIGS. 1 to 27 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, For example, of manufacturing techniques and/or tolerances, are to be expected. Thus, example embodiments should not be construed as limited to the particular shapes of regions illustrated herein but are to include deviations in shapes that result, For example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
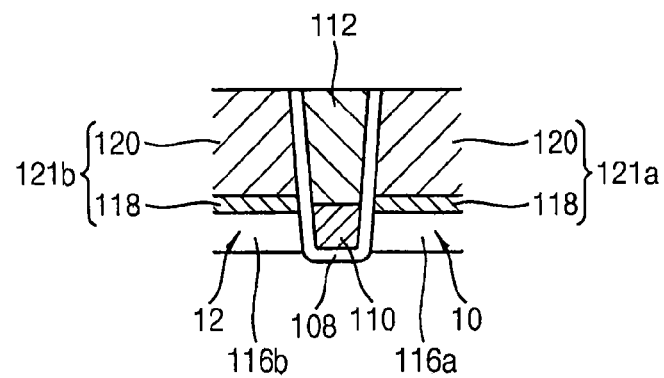

FIG. 1 is a cross-section illustrating a semiconductor device in accordance with some embodiments. FIG. 2 is a cross-section illustrating a transistor of the semiconductor device in FIG. 1 in accordance with some embodiments. In some embodiments, the semiconductor device may include a dynamic random access memory (DRAM) device. Embodiments of the present inventive concept are discussed herein with respect to the DRAM device, but it will be understood that embodiments of the present inventive concept are not limited to this configuration.

Referring now to FIGS. 1 and 2, the semiconductor device may include a transistor. The transistor may be formed on a substrate 100, and may include a buried gate structure 113, first and second impurity regions 116a and 116b, and first and second buried contact structures 121a and 121b. The semiconductor device may further include first and second contact plugs 127 and 132, a bit line 128 and a capacitor 140.

The substrate 100 may be, for example, a silicon substrate, a germanium substrate, a silicon-germanium substrate, a silicon-on-insulator (SOI) substrate, a germanium-on-insulator (GOI) substrate, and the like.

A field region of which a top surface may be covered by an isolation layer 102 and an active region of which a top surface may not be covered by the isolation layer 102 may be defined in the substrate 100. The isolation layer 102 may fill a trench (not shown) of the substrate 100. In some embodiments, the active region may extend in a direction having an acute angle with a first direction in which the buried gate structure 113 may extend. However, in some embodiments, the active region may extend in a direction substantially perpendicular to the first direction without departing from the scope of the present inventive concept.

The substrate 100 may include a gate trench (not shown) extending in the first direction. A bottom of the gate trench may be higher than a bottom of the isolation layer 102.

The buried gate structure 113 may fill the gate trench, and may protrude from a top portion of the gate trench. In some embodiments, a top surface of the buried gate structure 113 may be substantially coplanar with that of the isolation layer 102.

The buried gate structure 113 may include a gate insulation layer pattern 108, a gate electrode 110 and a capping layer pattern 112. The gate electrode 110 and the capping layer pattern 112 may be sequentially stacked on the gate insulation layer pattern 108.

The gate insulation layer pattern 108 may be formed on an inner wall of the gate trench, and may have a hollow cylindrical shape. The gate electrode 110 may be formed on the gate insulation layer pattern 108, and may fill the gate trench. The capping layer pattern 112 may be formed on the gate electrode 110, and may protrude from the top portion of the gate trench.

In some embodiments, the gate insulation layer pattern 108 may cover sidewalls of the gate electrode 110 and the capping layer pattern 112, and a bottom of the gate electrode 110. In some embodiments, the gate insulation layer pattern 108 may include, for example, a thermal oxide layer, which may be formed by a thermal oxidation process on a portion of the substrate 100 exposed by the gate trench.

The gate electrode 110 may include a metal. In some embodiments, the gate electrode 110 may include a metal layer (not shown) and a barrier layer (not shown) covering a sidewall and a bottom of the metal layer. For example, the gate electrode 110 may include a tungsten layer serving as the metal layer and a tungsten nitride layer serving as the barrier layer. In some embodiments, the gate electrode 110 may include polysilicon. The capping layer pattern 112 may include a nitride, for example, silicon nitride.

In some embodiments, two buried gate structures 113 may be formed on each of the active regions, and may be spaced apart from each other. Each of the active regions may include a first region 10 at a portion thereof between the buried gate structures 113 and second regions 12 at portions thereof adjacent to both outer sidewalls of the buried gate structures 113.

In some embodiments, top surfaces of the first and second regions 10 and 12 may be lower than that of the gate electrode 110. Furthermore, the top surfaces of the first and second regions 10 and 12 may be higher than a central portion of the gate electrode 110 corresponding to about ½ of a height of the gate electrode 110, which may be measured from a bottom portion to a top portion thereof.

The first and second impurity regions 116a and 116b may be formed at the first and second regions 10 and 12, respectively. The first and second impurity regions 116a and 116b may serve as source/drain regions of the transistor.

According to the positions of bottoms of the first and second impurity regions 116a and 116b, a length of a channel of the transistor may be changed. When the bottoms of the first and second impurity regions 116a and 116b become lower, the channel length of the transistor may be decreased. Furthermore, as the channel length decreases, a resistance of the channel may decrease, and operating currents of the transistor may increase. Thus, the bottoms of the first and second impurity regions 116a and 116b may be formed to be as low as possible so as to increase the operating currents of the transistor. However, in these embodiments, the transistor has to satisfy leakage current conditions.

Top surfaces of the first and second impurity regions 116a and 116b may be substantially the same as those of the first and second regions 10 and 12, respectively, and thus may be lower than that of the gate electrode 110. In other words, at least a portion of each of the first and second impurity regions 116a and 116b may face to a sidewall of the gate electrode 110. Furthermore, the bottoms of the first and second impurity regions 116a and 116b may be lower than the central portion of the gate electrode 110 corresponding to about ½ of the height of the gate electrode 110. In some embodiments, the bottoms of the first and second regions 116a and 116b may be close to the bottom of the buried gate structure 113.

A depth of each of the first and second impurity regions 116a and 116b from a top surface of the active region may be less than the height of the gate electrode 110.

The first buried contact structure 121a may contact the first impurity region 116a, and the second buried contact structures 121b may contact the second impurity regions 116b. The first and second buried contact structures 121a and 121b may have substantially the same stacked structure. In some embodiments, top surfaces of the first and second buried contact structures 121a and 121b may be substantially coplanar with that of the buried gate structure 113. Thus, the first and second buried contact structures 121a and 121b may face the buried gate structure 113. Furthermore, the top surfaces of the first and second buried contact structures 121a and 121b may be substantially coplanar with that of the isolation layer 102.

Each of the first and second buried contact structures 121a and 121b may include a metal silicide pattern 118 and a buried contact plug 120 sequentially stacked.

The metal silicide pattern 118 may serve as an ohmic layer. Furthermore, the metal silicide pattern 118 may apply stress to a channel region of the transistor, and thus the charge mobility of the transistor may increase.

The metal silicide pattern 118 may directly contact each of the first and second impurity regions 116a and 116b. Thus, a bottom of the metal silicide pattern 118 may be lower than a top surface of the gate electrode 110. The metal silicide pattern 118 may be close to the channel region, so that the stress may be sufficiently applied to the channel region during a formation of the metal silicide pattern 118. Furthermore, according to a type of the metal silicide pattern 118, mechanical stress applied to the channel region may be controlled, so that the charge mobility may be controlled or increased. When the transistor is a negative-channel metal oxide semiconductor (NMOS) transistor, a compressive stress may be generated at the metal silicide pattern 118 so that a tensile stress may be applied to the channel region. Thus, the charge mobility of the NMOS transistor may increase. When the transistor is a positive-channel metal oxide semiconductor (PMOS) transistor, the tensile stress may be generated at the metal silicide pattern 118 so that the compressive stress may be applied to the channel region. Thus, the charge mobility of the PMOS transistor may increase.

The metal silicide pattern 118 may include, for example, tungsten silicide, titanium silicide, tantalum silicide, cobalt silicide, nickel silicide, molybdenum silicide, and the like.

The buried contact plug 120 may include a metal having a low resistance, for example, tungsten (W), platinum (Pt), palladium (Pd), rhodium (Rh), ruthenium (Ru), iridium (Ir), copper (Cu), aluminum (Al), titanium (Ti), tantalum (Ta), and the like, or a metal nitride thereof. For example, the buried contact plug 120 may include tungsten.

The buried contact plug 120 may be close to the channel region, and thus stress may be additionally applied to the channel region during a formation of the buried contact plug 120. According to a type of a metal or a total volume of the buried contact plug 120, mechanical stress applied to the channel region may be controlled, so that the charge mobility may be controlled or increased.

In some embodiments, a height of each of the first and second buried contact structures 121a and 121b, which may be measured from a bottom portion to a top portion thereof, may be greater than a depth of each of the first and second impurity regions 116a and 116b, which may be measured from a top portion to a bottom portion thereof. Accordingly as the height of each of the first and second contact structures 121a and 121b increase, a total resistance of a structure including one of the buried contact structures 121a and 121b and one of the impurity regions 116a and 116b corresponding thereto may decrease.

When the first and second buried contact structures 121a and 121b are not formed, the depths of the first and second impurity regions 116a and 116b may increase. Thus, a resistance of each of the first and second impurity regions 116a and 116b, i.e., a spreading resistance, may increase. In these embodiments, in order to reduce the spreading resistance, each of the first and second impurity regions 116a and 116b has to have high doping concentration.

However, in some embodiments, the first and second buried contact structures 121a and 121b may be formed on the first and second impurity regions 116a and 116b, respectively. Thus, even though each of the first and second impurity regions 116a and 116b may not have a high doping concentration, the total resistance of a structure including one of the buried contact structures 121a and 121b and one of the impurity regions 116a and 116b corresponding thereto may decrease.

As discussed above, the transistor may have high operating currents and charge mobility. The transistor may serve as a switching element of a memory cell in a various types of memory devices.

An etch stop layer 122 and a first insulating interlayer 124 may be formed on the buried gate structure 113, the first and second buried contact structures 121a and 121b, and the isolation layer 102. The etch stop layer 122 may include a nitride, for example, silicon nitride. The first insulating interlayer 124 may include an oxide, for example, silicon oxide.

The first contact plug 126 may be formed through the first insulating interlayer 124 and the etch stop layer 122, and may contact the first buried contact structure 121a. The first contact plug 126 may include a metal.

The bit line 128 may be formed on the first insulating interlayer 124, and may contact the first contact plug 126. The bit line 128 may extend in a second direction substantially perpendicular to the first direction. Thus, the bit line 128 and the first buried contact structure 121a may be electrically connected to each other via the first contact plug 126. The bit line 128 may include, for example, doped polysilicon and/or a metal, for example, tungsten. The bit line 128 may have a single layer structure or a multi-layered structure.

A hard mask (not shown) may be formed on the bit line 128. Spacers (not shown) may be formed on sidewalls of a structure including the bit line 128 and the hard mask stacked.

The second insulating interlayer 130 may be formed on the first insulating interlayer 124 to cover the bit line 128.

The second contact plug 132 may be formed through the first and second insulating interlayers 124 and 130 and the etch stop layer 122, and may contact the second buried contact structure 121b. The second contact plug 132 may include a metal. The second contact plug 132 may not be electrically connected to the bit line 128.

The capacitor 140 may contact the second contact plug 132. The capacitor 140 and the second buried contact structure 121b may be electrically connected to each other via the second contact plug 132.

The capacitor 140 may include a lower electrode 134, a dielectric layer 136 and an upper electrode 138 sequentially stacked. The lower electrode 134 may include, for example doped polysilicon, a metal and/or a metal nitride. The lower electrode 134 may have a hollow cylindrical shape. The dielectric layer 136 may include, for example, silicon nitride or a high-k material having a dielectric constant higher than that of silicon nitride. The upper electrode 138 may include, for example doped polysilicon, a metal and/or a metal nitride.

The semiconductor device may include the transistor having high operating currents and charge mobility. Thus, the semiconductor device may have good electrical characteristics.

Figure 3:
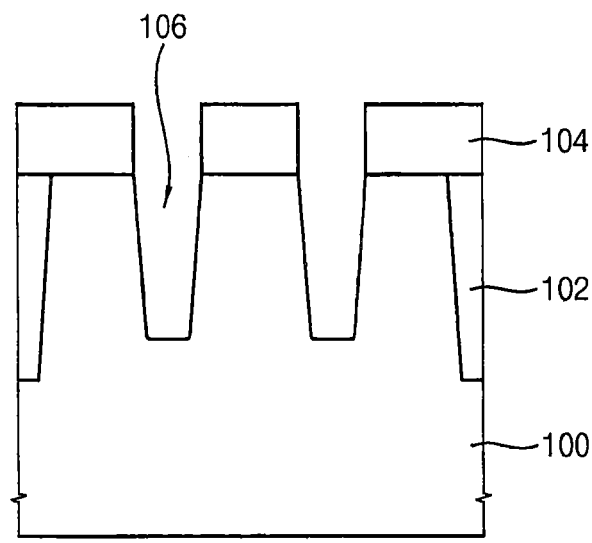

Referring now to FIGS. 3 to 12, cross-sections illustrating processing steps in the fabrication of the semiconductor device in FIG. 1 in accordance with some embodiments of the present inventive concept will be discussed. Referring first to FIG. 3, an upper portion of a substrate 100 may be etched to form an isolation trench, and an isolation layer 102 may be formed to fill the isolation trench. The isolation layer 102 may be formed to include an oxide, for example, silicon oxide.

A portion of the substrate 100 on which no isolation trench is formed may protrude from the other portions of the substrate 100, and may serve as a preliminary active region. A plurality of preliminary active regions may be formed to have an island shape. In some embodiments, each of the preliminary active regions may be formed to extend to a given length in a direction, which may have an acute angle with or substantially perpendicular to a first direction in which a buried gate structure 113 (refer to FIG. 5) may extend.

In some embodiments, impurities may be implanted into the substrate 100 to control a threshold voltage of a transistor.

A hard mask 104 may be formed on a substrate 100 to expose a portion of the substrate 100 for forming a gate trench. The hard mask 104 may be formed to include, for example, silicon nitride or polysilicon. The hard mask 104 may be formed to extend in the first direction.

The preliminary active region of the substrate 100 and the isolation layer 102 may be etched using the hard mask 104 as an etching mask to form a preliminary gate trench 106. The preliminary gate trench 106 may extend in the first direction. In some embodiments, two preliminary gate trenches 106 may be formed in each of the preliminary active regions, and may be spaced apart from each other. The bottom of the preliminary gate trench 106 may be higher than that of the isolation layer 102 so that neighboring transistors may be electrically isolated from each other.

Figure 4:
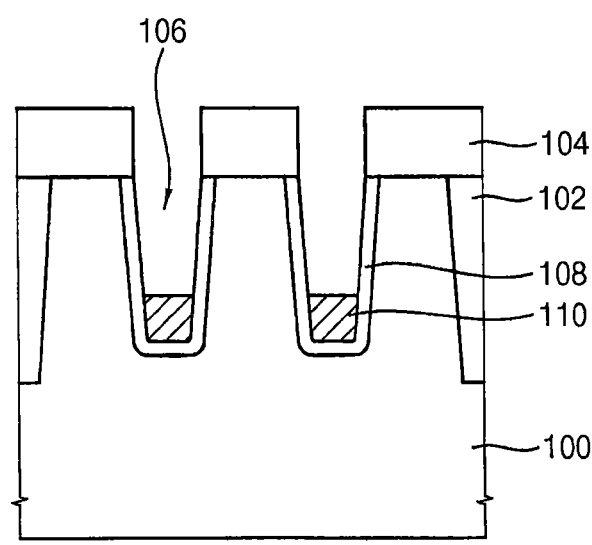

Referring now to FIG. 4, a gate insulation layer pattern 108 may be formed on a sidewall and the bottom of the preliminary gate trench 106 to have a hollow cylindrical shape. The gate insulation layer pattern 108 may be formed to include, for example, silicon oxide. In some embodiments, the gate insulation layer pattern 108 may be formed by a thermal oxidation. In other words, the gate insulation layer pattern 108 may include thermal oxide, which may have less crystal defect and good endurance during an etching process subsequently performed.

A conductive layer may be formed on the gate insulation layer pattern 108 to fill the preliminary gate trench 106. In some embodiments, the conductive layer may be formed to include a metal layer (not shown) and a barrier layer (not shown) covering a sidewall and a bottom of the metal layer. The barrier layer may be formed to include, for example, titanium, titanium nitride, tantalum, tantalum nitride, and the like. The barrier layer may be formed to have a single layer structure or a multi-layered structure including a plurality of barrier layers sequentially stacked. The metal layer may be formed to include, for example, tungsten.

An upper portion of the conductive layer may be planarized until the top surface of the hard mask 104 may be exposed, and may be partially etched to form a gate electrode 110 filling a lower portion of the preliminary gate trench 106. In some embodiments, the planarization process may be performed by a chemical mechanical polishing (CMP) process and/or an etch back process.

Figure 5:
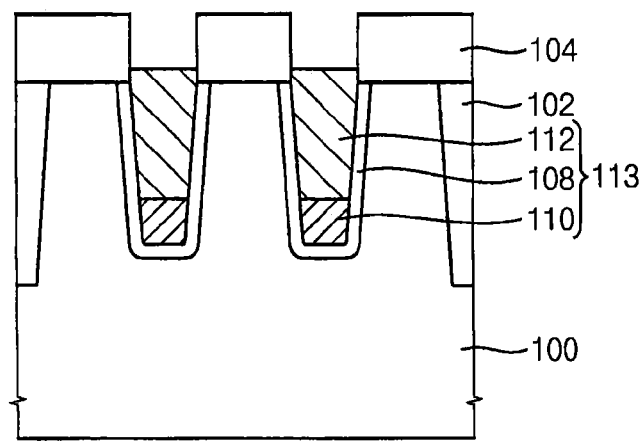

Referring to FIG. 5, a capping layer may be formed on the gate electrode 110 and the hard mask 104 to sufficiently fill the preliminary gate trench 106. An upper portion of the capping layer may be etched to form a capping layer pattern 112 on the gate electrode 110. In some embodiments, the upper portion of the capping layer may be etched until a top surface of the capping layer may be slightly higher that of the substrate 100. The capping layer pattern 112 may include a nitride, for example, silicon nitride.

Thus, the buried gate structure 113 extending in the first direction may be formed to fill the preliminary gate trench 106. Furthermore, two buried gate structures 113 may be formed on each of the active regions, which may be spaced apart from each other.

Figure 6:
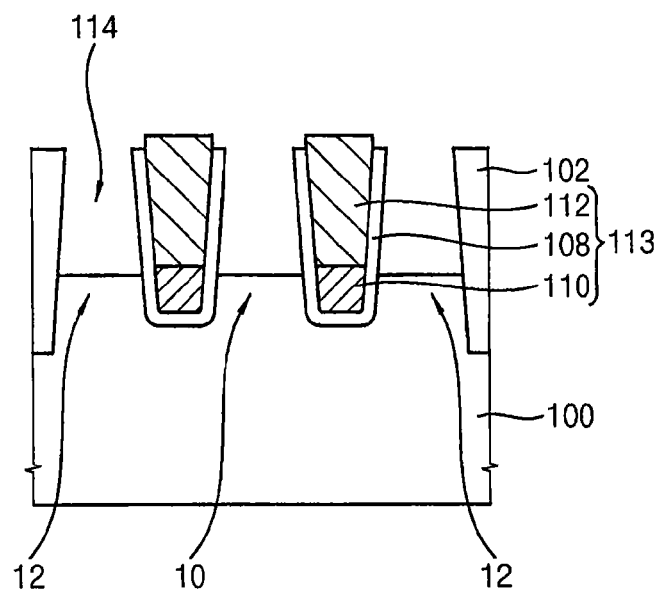

Referring now to FIG. 6, the hard mask 104 may be removed. The preliminary active region of the substrate 100 may be partially etched to form a recess 114. The etching process may include an anisotropic etching process and/or an isotropic etching process without departing from the scope of the present inventive concept.

Accordingly as the recess 114 is formed, the preliminary active region of the substrate 100 may be transformed into an active region, and a depth of the preliminary gate trench 106, which may be measured from a top surface of the active region, may be decreased to form a gate trench. Furthermore, the buried gate structure 113 may fill the gate trench, and may protrude from a top portion of the gate trench.

The active region may include a first region 10 at a portion thereof between the buried gate structures 113 and second regions 12 at portions thereof adjacent to both outer sidewalls of the buried gate structures 113.

Top surfaces of the first and second regions 10 and 12 may be lower than that of the gate electrode 110. The top surfaces of the first and second regions 10 and 12 may be higher than a central portion of the gate electrode 110 corresponding to about ½ of a height of the gate electrode 110, which may be measured from a bottom portion to a top portion thereof.

In some embodiments, the preliminary active region of the substrate 100 may be anisotropically etched to form a preliminary recess (not shown). A sidewall of the preliminary recess may be isotropically etched to form the recess 114 exposing the gate insulation layer pattern 108. Thus, plasma damage to the gate insulation layer pattern 108 by the anisotropic etching process may decrease.

In some embodiments, silicon may remain on the sidewall of the recess 114 after the etching processes. However, the remaining silicon may be transformed into a metal silicide by processes subsequently performed, which may not generate process failures.

Figure 7:
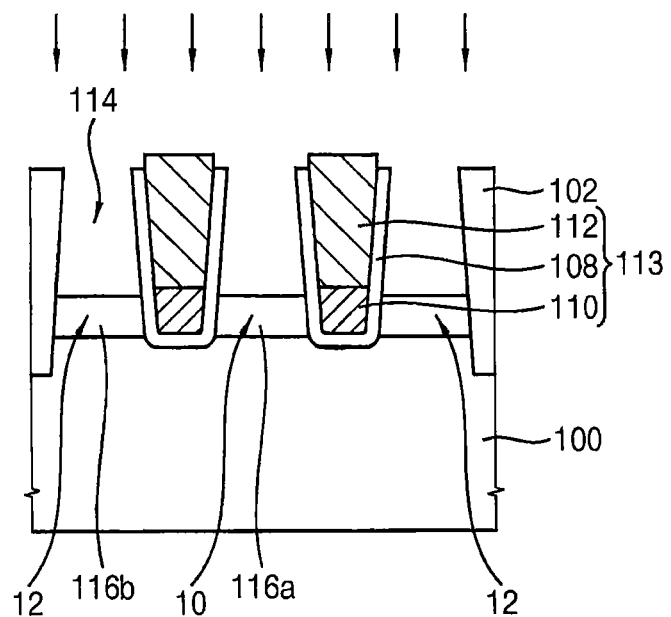

Referring now to FIG. 7, impurities may be implanted into the first and second regions 10 and 12 to form first and second impurity regions 116a and 116b, respectively.

Top surfaces of the first and second impurity regions 116a and 116b may be formed to be lower than that of the gate electrode 110. A bottom of each of the first and second impurity regions 116 and 116b may be formed to be lower than the central portion of the gate electrode 110 corresponding to about ½ of the height of the gate electrode 110. In some embodiments, the bottoms of the first and second impurity regions 116a and 116b may be formed to be close to the bottom of the buried gate structure 113.

Depths of the first and second impurity regions 116a and 116b may be decreased according to the etching of the substrate 100 in the previous process. Thus, the implantation process may be easily performed on the substrate 100. Furthermore, each of the first and second impurity regions 116a and 116b may be controlled to have a target depth.

Figure 8:
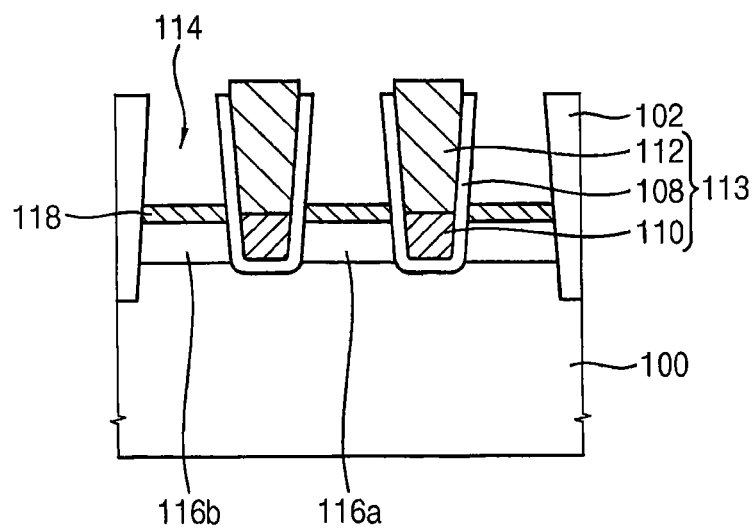

Referring now to FIG. 8, a metal silicide pattern 118 may be formed on the first and second regions 10 and 12. In particular, a metal layer may be formed on the first and second regions 10 and 12. The metal layer and silicon of the first and second regions 10 and 12 may be reacted with each other by an annealing process to form the metal silicide pattern 118 on the first and second regions, which may be referred to as a silicidation process. When silicon remains on the sidewall of the recess 114, the remaining silicon may be transformed into a metal silicide pattern by the silicidation process. Then, a portion of the metal layer not reacted with silicon may be removed.

The metal silicide pattern 118 may be formed to include, for example, cobalt silicide, nickel silicide, titanium silicide, tantalum silicide, molybdenum silicide, tungsten silicide, and the like.

In the silicidation process, stress may be applied to the substrate 100. A portion of the metal silicide pattern 118 may face a sidewall of the gate electrode 110, and thus the metal silicide pattern 118 may be adjacent to a channel region of the transistor. Thus, the stress generated during the silicidation process may be applied not only to the first and second regions 10 and 12 but also to the channel region. Accordingly, as the stress is applied to the channel region, the charge mobility of transistor may increase. Furthermore, according to a type of the metal silicide pattern 118, mechanical stress applied to the channel region may be changed, and thus the charge mobility of the transistor may be controlled.

Figure 9:
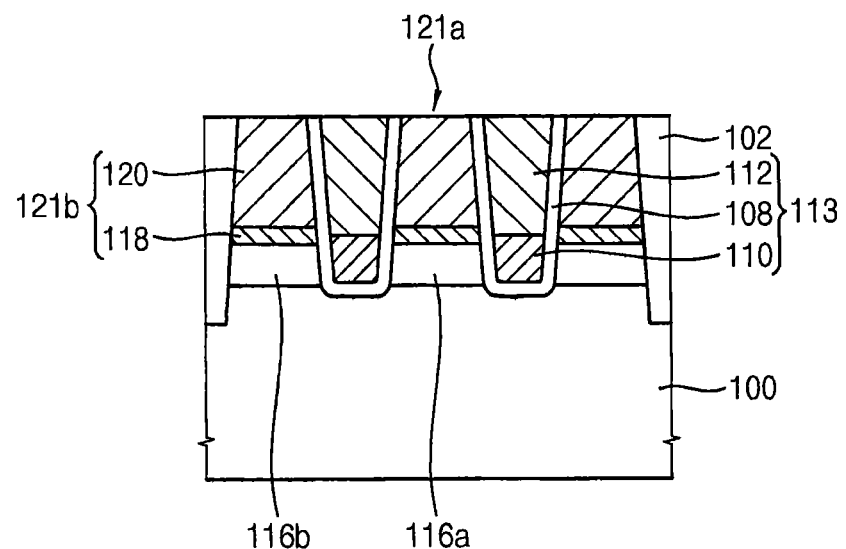

Referring now to FIG. 9, a metal layer may be formed on the metal silicide pattern 118 to fill the recess 114. The metal layer may be formed to include a metal, for example, tungsten (W), platinum (Pt), palladium (Pd), rhodium (Rh), ruthenium (Ru), iridium (Ir), copper (Cu), aluminum (Al), titanium (Ti), tantalum (Ta), etc., or a metal nitride thereof. In some embodiments, the metal layer may be formed to include tungsten.

An upper portion of the metal layer may be planarized until the top surface of the isolation layer 102 may be exposed to form a buried contact plug 120 filling the recess 114.

Accordingly as the buried contact plug 120 is formed adjacent to the channel region, the stress may be additionally applied to the channel region during the formation of the buried contact plug 120. Furthermore, according to a type of the metal or a total volume of the buried contact plug 120, mechanical stress applied to the channel region may be changed, and thus the charge mobility of the transistor may be controlled, or may increase.

Thus, a first buried contact structure 121a and second buried contact structures 121b each including a metal silicide pattern and a buried contact plug sequentially stacked may be formed on the first region 10 and the second regions 12, respectively.

As described above, the transistor including the buried gate structure 113, the first and second impurity regions 116a and 116b, and the first and second buried contact structures 121a and 121b may be formed on the substrate 100.

Figure 10:
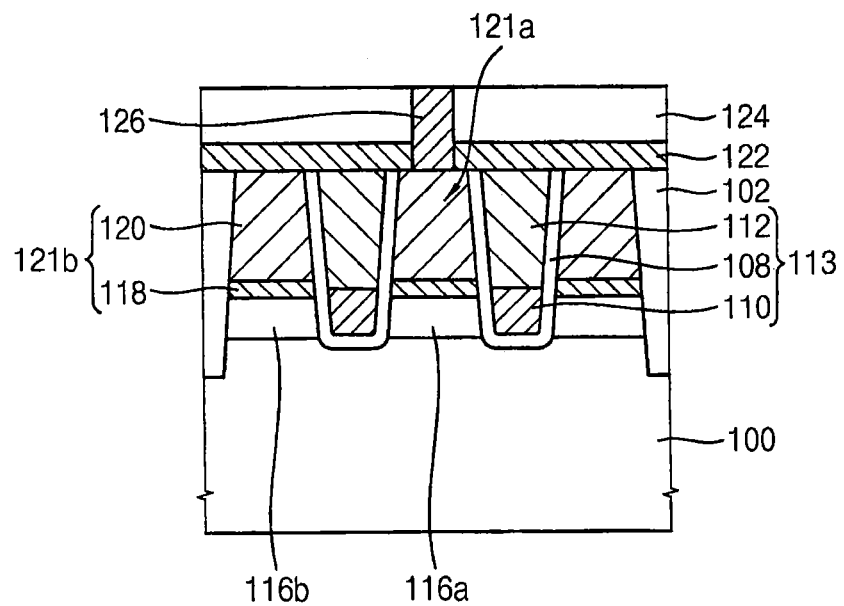

Referring now to FIG. 10, an etch stop layer 122 and a first insulating interlayer 124 may be formed on the buried gate structure 113, the first and second buried contact structures 121a and 121b, and the isolation layer 102. The etch stop layer 122 may be formed to include a nitride, for example, silicon nitride. The first insulating interlayer 124 may be formed to include an oxide, for example, silicon oxide.

The first insulating interlayer 124 and the etch stop layer 122 may be etched to form a first contact hole (not shown) exposing the first buried contact structure 121a. A first conductive layer may be formed on the first buried contact structure 121a and the first insulating interlayer 124 to fill the first contact hole. The first conductive layer may be formed to include a metal.

The first conductive layer may be planarized until a top surface of the first insulating interlayer 124 may be exposed to form a first contact plug 126 filling the first contact hole.

In some embodiments, the planarization process may be performed by a CMP process and/or an etch back process. The first contact plug 126 may be formed through the first insulating interlayer 124 and the etch stop layer 122 to contact the first buried contact structure 121a.

Figure 11:
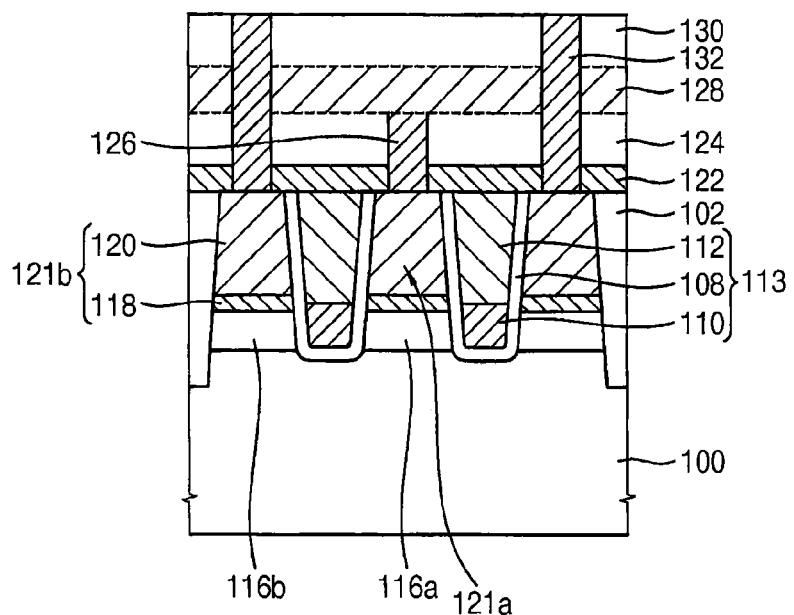

Referring now to FIG. 11, a second conductive layer may be formed on the first contact plug 126 and the first insulating interlayer 124. The second conductive layer may be formed to include a metal. A hard mask (not shown) may be formed on the second conductive layer. The hard mask may be formed to include a nitride, for example, silicon nitride. The hard mask may be formed to extend in the second direction.

The second conductive layer may be etched using the hard mask as an etching mask to form a bit line 128. Spacers (not shown) may be formed on sidewalls of the bit line 128 and the hard mask sequentially stacked.

A second insulating interlayer 130 may be formed to cover the bit line 128. The first and second insulating interlayers 124 and 130 and the etch stop layer 122 may be etched to form a second contact hole (not shown) exposing the second buried contact structure 121b. In some embodiments, a plurality of bit lines 128 may be formed, and the second contact hole may be formed between the bit lines 128.

A third conductive layer may be formed on the second buried contact structure 121b and the second insulating interlayer 130 to fill the second contact hole. The third conductive layer may be formed to include a metal.

The third conductive layer may be planarized until a top surface of the second insulating interlayer 130 may be exposed to form a second contact plug 132 filling the second contact hole. In some embodiments, the planarization process may be performed by a CMP process and/or an etch back process. The second contact plug 132 may be formed through the first and second insulating interlayers 124 and 130 and the etch stop layer 122 to contact the second buried contact structure 121b.

Figure 12:
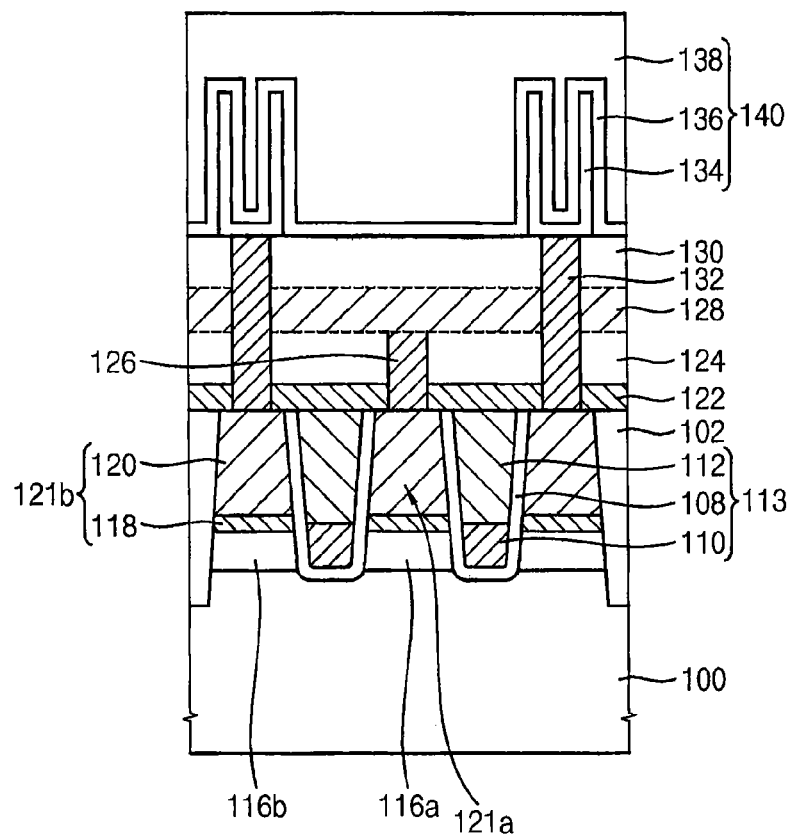

Referring to FIG. 12, a capacitor 140 may be formed on the second contact plug 142. The capacitor 140 may include a lower electrode 134, a dielectric layer 136 and an upper electrode 138 sequentially stacked.

As described above, the semiconductor device shown in FIG. 1 may be manufactured. The semiconductor device may include the transistor having high operating currents and charge mobility. Thus, the semiconductor device may have good electrical characteristics.

Figure 13:
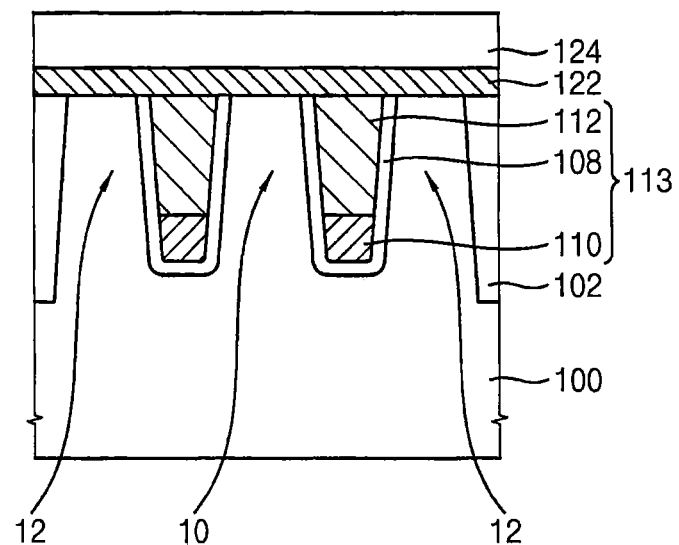

FIGS. 13 to 19 are cross-sections illustrating processing steps in the fabrication of the semiconductor device in FIG. 1 in accordance with some embodiments. Referring to FIG. 13, processes substantially the same as or similar to those illustrated with reference to FIGS. 3 to 5 may be performed to form a buried gate structure 113 having a gate insulation layer pattern 108, a gate electrode 110, and a capping layer pattern 112 on a substrate 100. In some embodiments, a plurality of buried gate structure 113 may be formed on the substrate 100.

The hard mask 104 (refer to FIG. 5) may be removed to expose a top surface of the substrate 100. The substrate 100 may include a first region 10 at a portion thereof between the buried gate structures 113 and second regions 12 at portions thereof adjacent to both outer sidewalls of the buried gate structures 113.

An etch stop layer 122 and a first insulating interlayer 124 may be formed on the buried gate structure 113, the isolation layer 102 and the substrate 100. The etch stop layer 122 may be formed to include a nitride, for example, silicon nitride.

The first insulating interlayer 124 may be formed to include an oxide, for example, silicon oxide. In other words, the etch stop layer 122 and a first insulating interlayer 124 may be formed on the substrate 100 before etching the substrate 100 adjacent to the buried gate structure 113.

Figure 14:
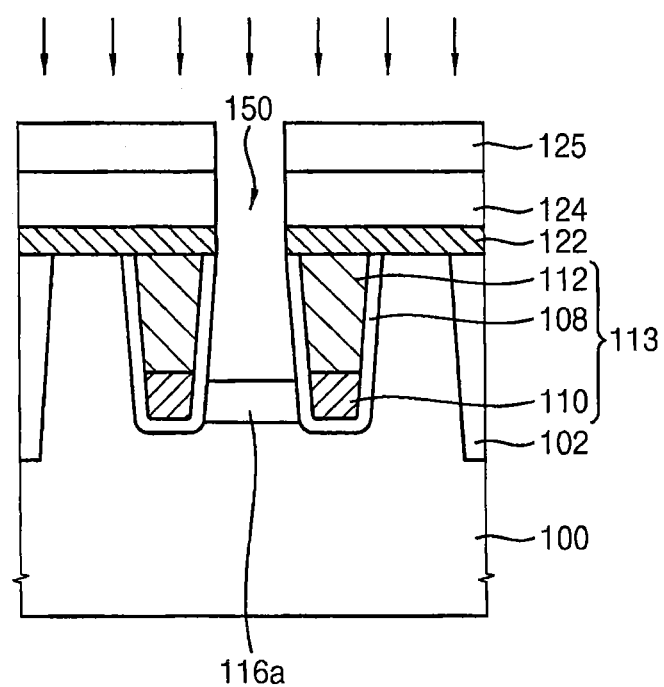

Referring to FIG. 14, a first etching mask 125 may be formed on the first insulating interlayer 124. The first insulating interlayer 124, the etch stop layer 122 and an upper portion of the first region 10 of the substrate 100 may be etched using the first etching mask 125 to form a first contact hole 150. The etching process may include an anisotropic etching process and/or an isotropic etching process.

The first region 10 of which the upper portion is removed may serve as a first active region. In some embodiments, the bottom of the first contact hole 150 may be lower than a top surface of the gate electrode 110. Furthermore, the bottom of the first contact hole 150 may be formed to be higher than a central portion of the gate electrode 110 corresponding to about ½ of a height of the gate electrode 110, which may be measured from a bottom portion to a top portion thereof.

In some embodiments, the first insulating interlayer 124, the etch stop layer 122 and the first region 10 of the substrate 100 may be anisotropically etched to form a preliminary first contact hole (not shown). A portion of the substrate 100 adjacent to a sidewall of the preliminary first contact hole may be isotropically etched to form the first contact hole 150. In some embodiments, the gate insulation layer pattern 108 may be exposed by the first contact hole 150. Alternatively, silicon may remain on a sidewall of the first contact hole after the etching processes.

Impurities may be implanted into the first active region exposed by the first contact hole 150 to form a first impurity region 116a. A top surface of the first impurity region 116a may be lower than that of the gate electrode 110. In some embodiments, the top surface of the first impurity region 116a may be formed to be higher than the central portion of the gate electrode 110 corresponding to about ½ of the height of the gate electrode 110.

A bottom of the first impurity region 116a may be formed to be lower than the central portion of the gate electrode 110 corresponding to about ½ of the height of the gate electrode 110. In some embodiments, the bottom of the first impurity region 116a may be formed to be close to the bottom of the buried gate structure 113.

Figure 15:
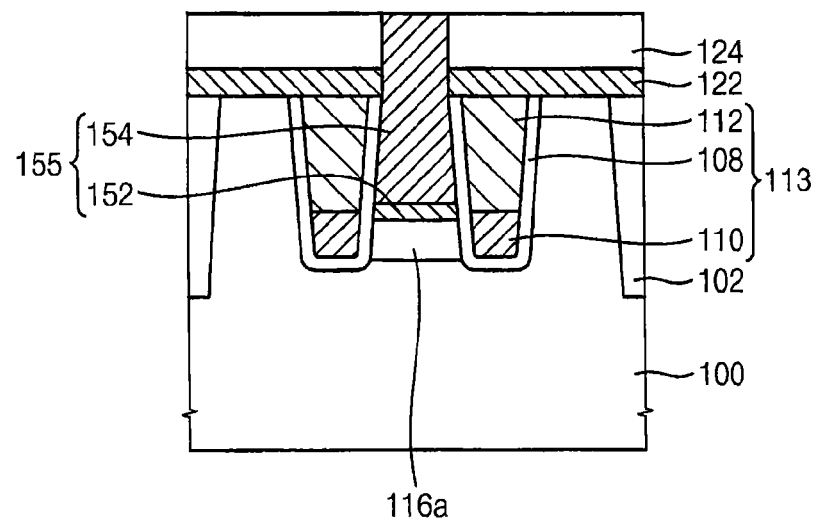

Referring to FIG. 15, a metal silicide pattern 152 may be formed on the first impurity region 116a. The metal silicide pattern 152 may be formed by performing a silicidation process substantially the same as or similar to that illustrated with reference to FIG. 8.

During the silicidation process, stress may be applied to the channel region so that the charge mobility of the transistor may increase.

A first conductive layer may be formed on the metal silicide pattern 152 to fill the first contact hole 150. The first conductive layer may be formed to include a metal.

An upper portion of the first conductive layer may be planarized until a top surface of the first insulating layer 124 may be exposed to form a first contact plug 154 filling the first contact hole 150. The first etching mask may be removed also in the planarization process and/or the etching process previously performed.

Thus, a first contact structure 155 including the metal silicide pattern 152 and the first contact plug 154 may be formed on the substrate 100. The first contact structure 155 may correspond to a structure including the first buried contact structure 121a and the first contact plug 126 shown in FIG. 1.

Figure 16:
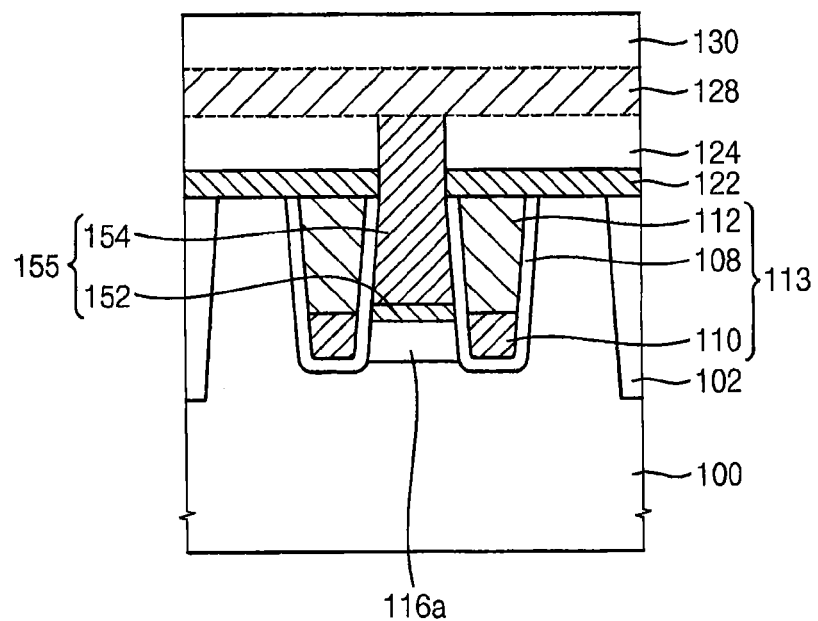

Referring to FIG. 16, a bit line 128 may be formed on the first contact plug 154 and the first insulating interlayer 124 to contact the first contact plug 154. A second insulating interlayer 130 may be formed to cover the bit line 128.

Figure 17:
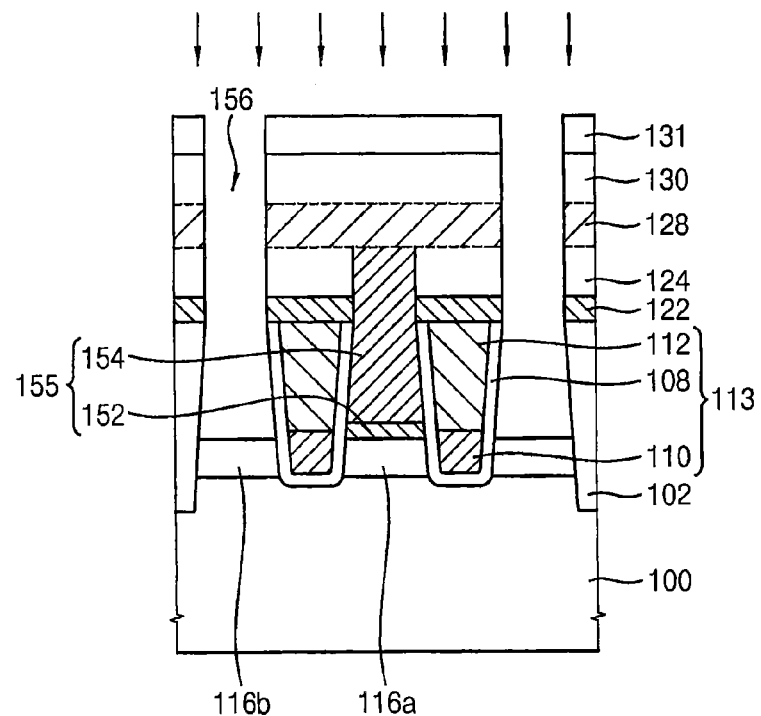

Referring to FIG. 17, a second etching mask 131 may be formed on the second insulating interlayer 130. The first and second insulation layers 124 and 130, the etch stop layer 122 and upper portions of the second regions 12 of the substrate 100 may be etched using the second etching mask 131 to form second contact holes 156. The etching process may include an anisotropic etching process and/or an isotropic etching process.

The second regions 12 of which the upper portions are removed may serve as a second active region. In some embodiments, the bottoms of the second contact holes 156 may be lower than a top surface of the gate electrode 110. The bottoms of second contact holes 156 may be disposed to be higher than the central portion of the gate electrode 110 corresponding to about ½ of the height of the gate electrode 110.

In some embodiments, the first and second insulating interlayers 124 and 130, the etch stop layer 122 and the second regions 12 of the substrate 100 may be anisotropically etched to form second preliminary contact holes (not shown). Portions of the substrate 100 adjacent to sidewalls of the preliminary second contact holes may be isotropically etched to form the second contact holes 156. In some embodiments, the gate insulation layer pattern 108 may be exposed by the second contact holes 156. In some embodiments, silicon may remain on sidewalls of the second contact holes 156.

Impurities may be implanted into the second active regions 12 exposed by the second contact holes 156 to form second impurity regions 116b. Top surfaces of the second impurity regions may be lower than that of the gate electrode 110. Bottoms of the second impurity regions 116b may be formed to be lower than the central portion of the gate electrode 110 corresponding to about ½ of the height of the gate electrode 110. In some embodiments, the bottoms of the second impurity regions 116b may be formed to be close to the bottom of the buried gate structure 113.

Figure 18:
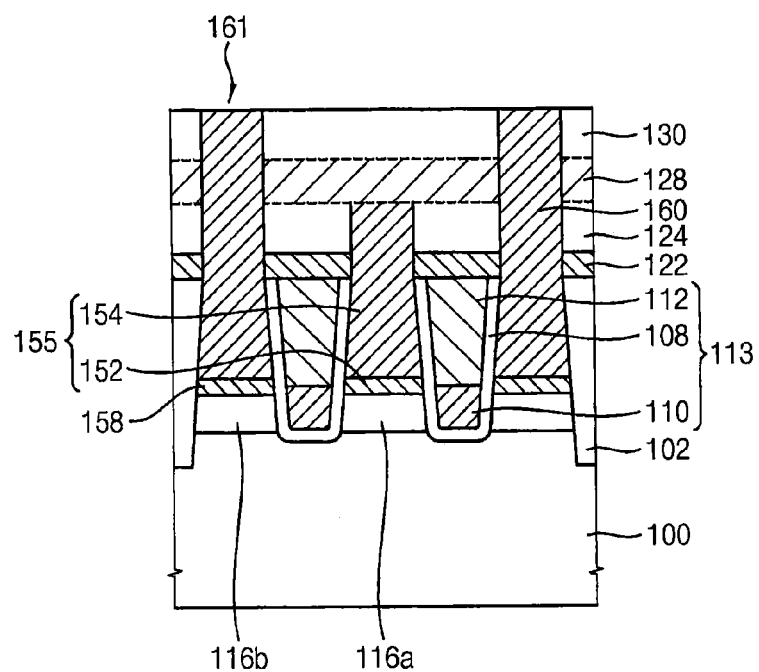

Referring to FIG. 18, a metal silicide pattern 158 may be formed on the second impurity regions 116b. The metal silicide pattern 158 may be formed by performing silicidation process substantially the same as or similar to that illustrated with reference to FIG. 8. During the silicidation process, stress may be applied to the channel region so that the charge mobility of the transistor may increase.

A second conductive layer may be formed on the metal silicide pattern 158 to fill the second contact holes 156. The second conductive layer may be formed to include a metal.

An upper portion of the second conductive layer may be planarized until a top surface of the second insulating layer 130 may be exposed to form a second contact plug 160 filling each of the second contact holes 156. The second etching mask 131 may be removed also in the planarization process and/or the etching process previously performed.

Thus, a second contact structure 161 including the metal silicide pattern 158 and the second contact plug 160 may be formed on the substrate 100. The second contact structure 161 may correspond to a structure including the second buried contact structure 121b and the second contact plug 132 shown in FIG. 1.

Figure 19:
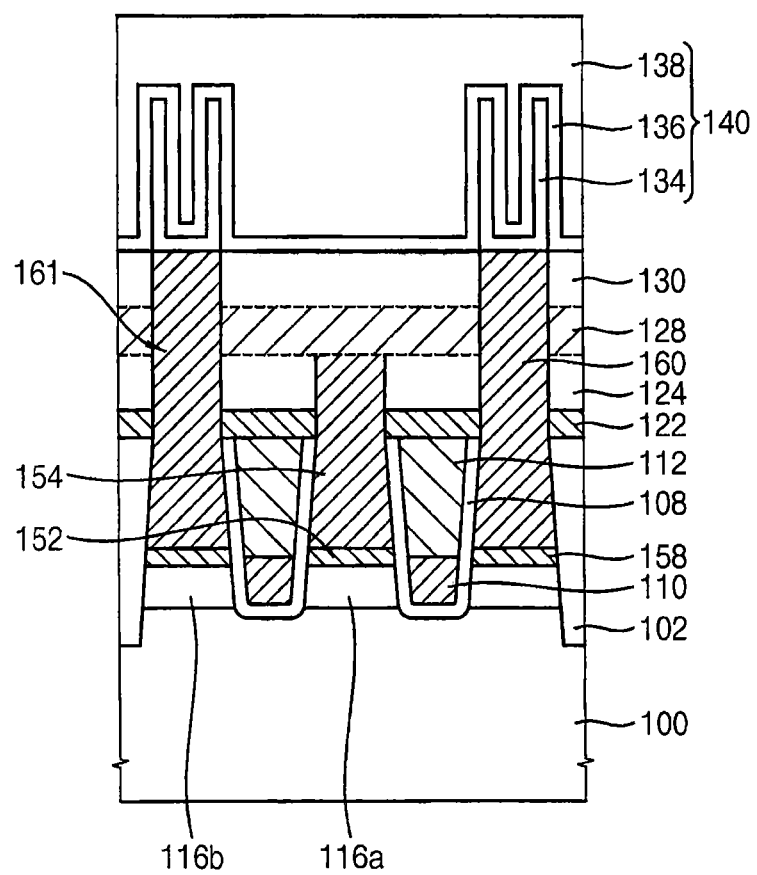

Referring to FIG. 19, a capacitor 140 may be formed on the second contact plug 160. The capacitor 140 may include a lower electrode 134, a dielectric layer 136 and an upper electrode 138 sequentially stacked.

As discussed above, the semiconductor device may include the transistor having high operating currents and charge mobility. Thus, the semiconductor device may have good electrical characteristics.

Figure 20:
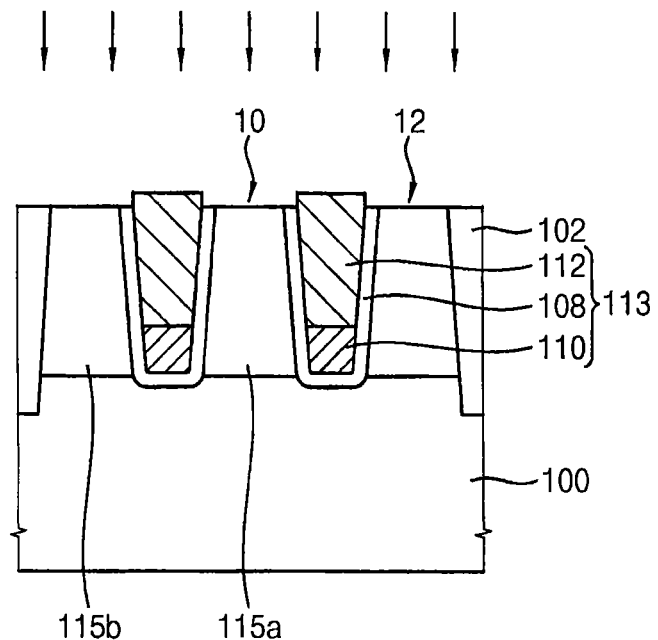

FIGS. 20 to 24 are cross-sections illustrating processing steps in the fabrication of the semiconductor device in FIG. 1 in accordance with some embodiments. Referring now to FIG. 20, processes substantially the same as or similar to those illustrated with reference to FIGS. 3 to 5 may be performed to form a buried gate structure 113 having a gate insulation layer pattern 108, a gate electrode 110, and a capping layer pattern 112 on a substrate 100. In some embodiments, a plurality of buried gate structure 113 may be formed on the substrate 100.

The hard mask 104 (refer to FIG. 5) may be removed to expose a top surface of the substrate 100. The substrate 100 may include a first region 10 at a portion thereof between the buried gate structures 113 and second regions 12 at a portion thereof adjacent to both outer sidewalls of the buried gate structures 113.

Impurities may be implanted into the substrate 100 of the first and second regions 10 and 12 to form preliminary first and second impurity regions 115a and 115b, respectively. Bottoms of the preliminary first and second impurity regions 115a and 115b may be formed to be lower than the central portion of the gate electrode 110 corresponding to about ½ of a height of the gate electrode 110. In some embodiments, the bottoms of the preliminary first and second impurity regions 115a and 115b may be formed to be closed to the bottom of the buried gate structure 113.

As described above, the implantation process may be performed before etching the substrate 100 adjacent to the buried gate structure 113.

Figure 21:
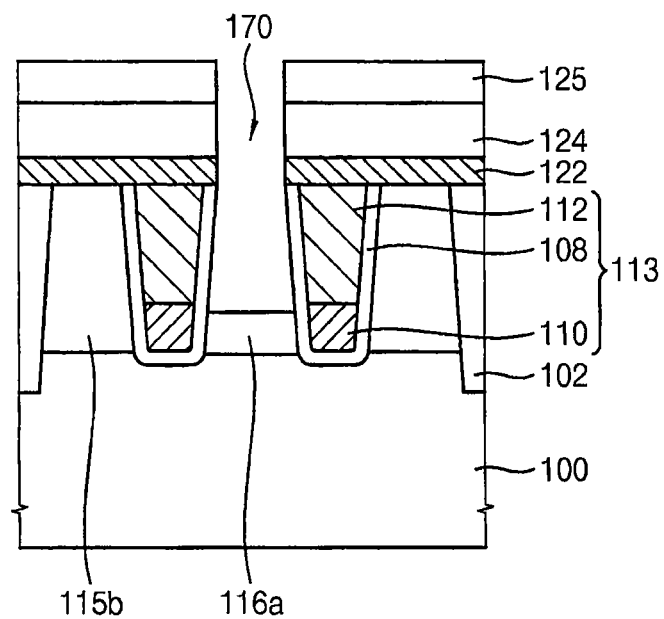

Referring to FIG. 21, an etch stop layer 122 and a first insulating interlayer 124 may be formed on the buried gate structure 113, the isolation layer 102 and the substrate 100.

A first etching mask 125 may be formed on the first insulating interlayer 124. The first insulating interlayer 124, the etch stop layer 122 and an upper portion of the first region 10 of the substrate 100 may be etched using the first etching mask 125 to form a first contact hole 170. The etching process may include an anisotropic etching process and/or an isotropic etching process.

The first region 10 of which the upper portion is removed may serve as a first active region. In some embodiments, the bottom of the first contact hole 170 may be lower than a top surface of the gate electrode 110. Furthermore, the bottom of the first contact hole 170 may be formed to be higher than a central portion of the gate electrode 110 corresponding to about ½ of a height of the gate electrode 110, which may be measured from a bottom portion to a top portion thereof.

When the first contact hole 170 is formed, an upper portion of the preliminary first impurity region 115a may be etched to form a first impurity region 116a. A top surface of the first impurity region 116a may be lower than that of the gate electrode 110. The top surface of the first impurity region 116a may be formed to be higher than the central portion of the gate electrode 110 corresponding to about ½ of a height of the gate electrode 110.

In some embodiments, impurities may be further implanted into the first active region to form the first impurity region 116a.

Figure 22:
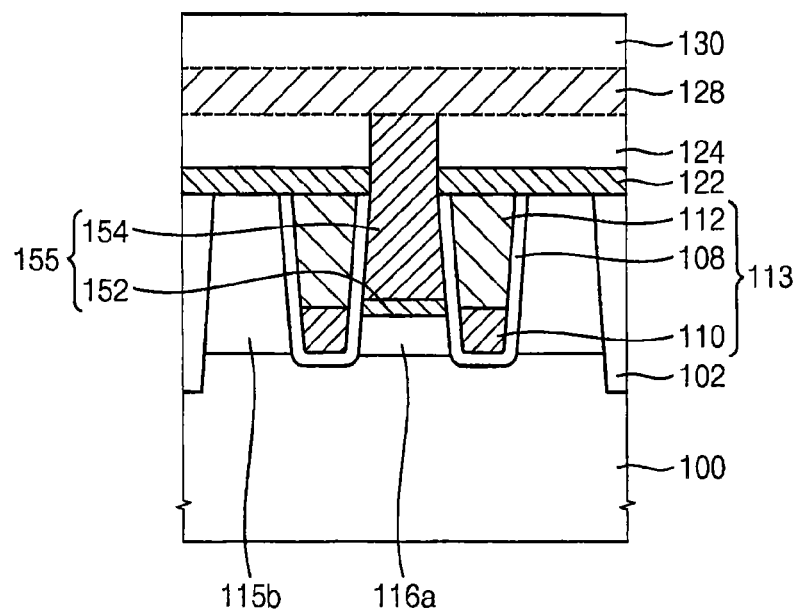

Referring to FIG. 22, a first contact structure 155 including the metal silicide pattern 152 and the first contact plug 154 may be formed to fill the first contact hole 170. A bottom of the first contact structure 155 may be lower than a top surface of the gate electrode 110. The first contact structure 155 may correspond to a structure including the first buried contact structure 121a and the first contact plug 126 shown in FIG. 1.

A bit line 128 may be formed on the first contact plug 154 and the first insulating interlayer 124 to contact the first contact plug 154. A second insulating interlayer 130 may be formed to cover the bit line 128.

The processes may be substantially the same as or similar to those discussed above with respect to FIGS. 15 to 16.

Figure 23:
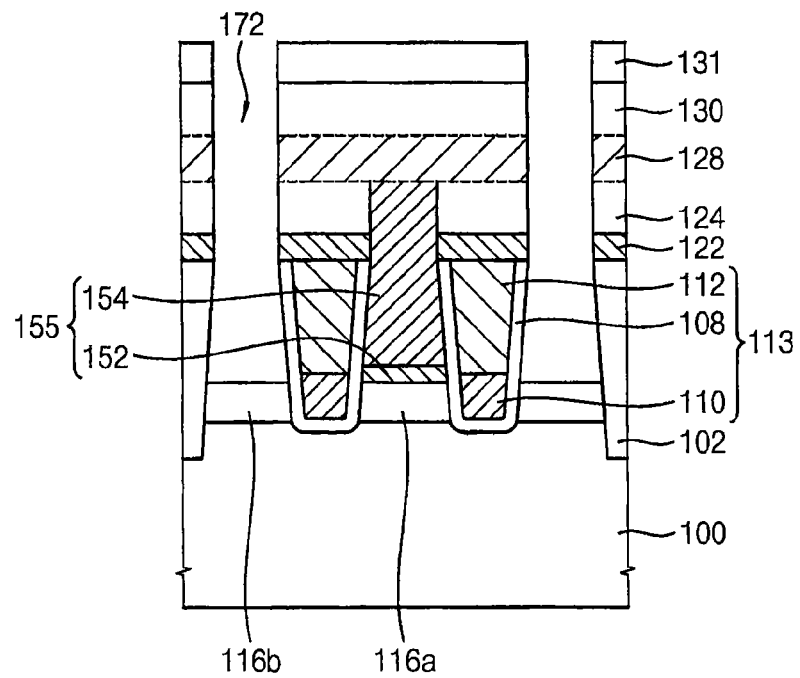

Referring to FIG. 23, a second etching mask 131 may be formed on the second insulating interlayer 130. The first and second insulation layers 124 and 130, the etch stop layer 122 and upper portions of the second regions 12 of the substrate 100 may be etched to form second contact holes 172. The etching process may include an anisotropic etching process and/or an isotropic etching process.

The second regions 12 of which the upper portions are removed may serve as a second active region. In some embodiments, the bottoms of the second contact holes 172 may be lower than a top surface of the gate electrode 110. The bottoms of second contact holes 172 may be formed to be higher than the central portion of the gate electrode 110 corresponding to about ½ of a height of the gate electrode 110.

In some embodiments, impurities may be further implanted into the second active regions to form the second impurity region 116b.

Figure 24:
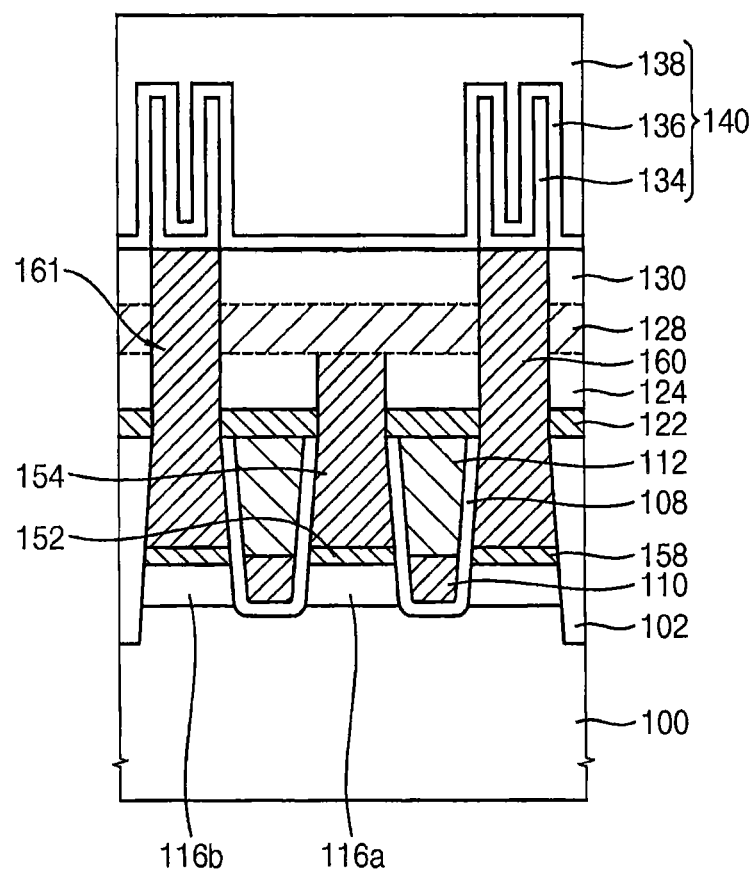

Referring to FIG. 24, a metal silicide pattern 158 may be formed on the second impurity regions 116b. The metal silicide pattern 158 may be formed by performing the silicidation process substantially the same as or similar to that illustrated with reference to FIG. 8. During the silicidation process, stresses may be applied to the channel region so that the charge mobility of the transistor may increase.

A second contact plug 160 may be formed on the metal silicide pattern 158 to fill each of the second contact holes 172. Thus, a second contact structure 161 including the metal silicide pattern 158 and the second contact plug 160 may be formed on the second impurity region 116b. A bottom of the second contact structure 161 may be lower than a top surface of the gate electrode 110. The second contact structure 161 may correspond to a structure including the second buried contact structure 121b and the second contact plug 158 shown in FIG. 1.

A capacitor 140 may be formed on the second contact plug 160. The capacitor 140 may include a lower electrode 134, a dielectric layer 136 and an upper electrode 138 sequentially stacked.

As discussed above, the semiconductor device may include the transistor having high operating currents and charge mobility. Thus, the semiconductor device may have good electrical characteristics.

In some embodiments, the semiconductor device may be a DRAM device including the transistor, the first and second contact plugs, a bit line and a capacitor, and the transistor may have the buried gate structure, first and second impurity regions and the first and second buried contact structures.

However, the above semiconductor device may be applied to various types of memory devices including the transistor without departing from the scope of the present inventive concept. For example, the transistor may serve as a switching element of memory cell in the various types of memory devices, for example, a magnetic random access memory (MRAM), a phase-change random access memory (PRAM), a resistive random access memory (ReRAM), etc.

Figure 25:
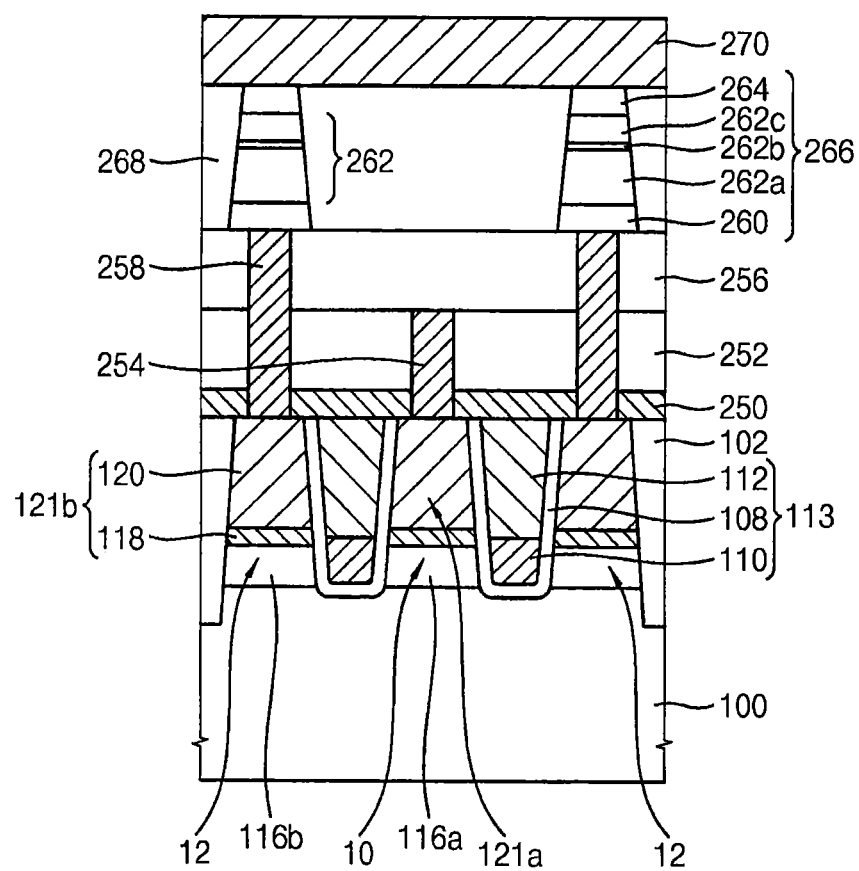

Referring now to FIG. 25, a cross-section illustrating a semiconductor device in accordance with some embodiments of the present inventive concept will be discussed. In some embodiments, the semiconductor device may include a variable resistance memory device As illustrated in FIG. 25, the semiconductor device may include a transistor. The transistor may be formed on a substrate 100, and may include a buried gate structure 113, first and second impurity regions 116a and 116b and first and second buried contact structures 121a and 121b. The semiconductor device may further include a source line 254, a contact plug 258, a variable resistance structure 266 and a bit line 270.

The transistor including the buried gate structure 113, the first and second impurity regions 116a and 116b and the first and second buried contact structures 121a and 121b may be substantially the same as or similar to that illustrated with reference to FIG. 1. The transistor may have high operating currents and charge mobility. The transistor may serve as a switching element of a memory cell in the semiconductor device.

An etch stop layer 250 and a first insulating interlayer 252 may be formed on the buried gate structure 113, the first and second buried contact structures 121a and 121b and the isolation layer 102. The etch stop layer 250 may include a nitride, for example, silicon nitride. The first insulating interlayer 252 may include an oxide, for example, silicon oxide.

The source line 254 may be formed through the first insulating interlayer 124 and the etch stop layer 122, and may extend in a direction. The source line 254 may contact the first buried contact structure 121a. The source line 254 may include a metal. The source line 254 may include a metal, for example, tungsten, titanium, tantalum, etc, and/or a metal nitride, for example, titanium nitride, tantalum nitride, etc.

The second insulating interlayer 256 may be formed on the first insulating interlayer 252 and the source line 254.

The contact plug 258 may be formed through the first and second insulating interlayers 252 and 256 and the etch stop layer 250, and may contact the second buried contact structure 121b. The contact plug 258 may include a metal.

The variable resistance structure 266 may be formed on the contact plug 258. In some embodiments, a plurality of variable resistance structures 266 may be formed to have an island shape from each other.

The variable resistance structure 266 may include a lower electrode 260, a variable resistance pattern 262 and an upper electrode 264 sequentially stacked.

The lower and upper electrodes 260 and 264 may include a metal nitride, for example, titanium nitride (TiNx), tungsten nitride (WNx), tantalum nitride (TaNx), zirconium nitride (ZrNx), etc, and/or a metal silicon nitride, for example, tungsten silicon nitride (WSiNx), titanium silicon nitride (TiSiNx), tantalum silicon nitride (TaSiNx), zirconium nitride (ZrNx), and the like.

In some embodiments, the variable resistance memory device may be an MRAM device, and thus the variable resistance pattern 262 may include a material of which a resistance may be changed by a magnetic field or a spin transfer torque (STT). In these embodiments, the variable resistance pattern 262 may include a magnetic tunnel junction (MTJ) structure including a fixed layer pattern 262a, a tunnel barrier layer pattern 262b and a free layer pattern 262c.

The fixed layer pattern 262a may include, for example, ferromanganese (FeMn), iridium manganese (IrMn), platinum manganese (PtMn), manganese oxide (MnO), manganese sulfide (MnS), tellurium manganese (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), chrome (Cr), etc.

In some embodiments, a lower ferromagnetic layer (not shown), an anti-ferromagnetic coupling spacer layer (not shown), and an upper ferromagnetic layer (not shown) may be further formed on the fixed layer pattern 262a. The lower and upper ferromagnetic layers may include, for example, iron (Fe), cobalt (Co), nickel (Ni), and the like. The anti-ferromagnetic coupling spacer layer may include, for example, ruthenium (Ru), iridium (Ir), rhodium (Rh), and the like.

The tunnel barrier layer pattern 262b may include, for example, magnesium oxide (MgOx), aluminum oxide (AlOx), and the like.

The free layer pattern 262c may include a ferromagnetic material such as iron (Fe), cobalt (Co), nickel (Ni), and the like.

However, it will be understood the MTJ structure is not limited by these examples, many modifications may be possible in the example embodiments without departing from the scope of the present inventive concept.

In some embodiments, the variable resistance memory device may be a ReRAM device, and thus the variable resistance pattern 262 may include a material of which a resistance may be changed by oxygen vacancy and/or a migration of oxygen.

In some embodiments, the variable resistance memory device may be a PRAM device, and thus the variable resistance pattern 262 may include a material of which a resistance may be changed by a phase change or a phase transition. In these embodiments, the variable resistance pattern 262 may include a chalcogenide-based material in which germanium (Ge), antimony (Sb) and/or tellurium (Te) are combined by a given ratio.

A third insulating interlayer 268 may fill a gap between the variable resistance structures 266.

The bit line 270 may be formed on the third insulating interlayer 268 and the variable resistance structure 266. The bit line 270 may contact the variable resistance structure, and may extend in the second direction. The bit line 270 may include a barrier layer and a metal layer sequentially stacked.

The semiconductor device may include the transistor having high operating currents and charge mobility. Thus, the semiconductor device may have good electrical characteristics.

Figure 26:
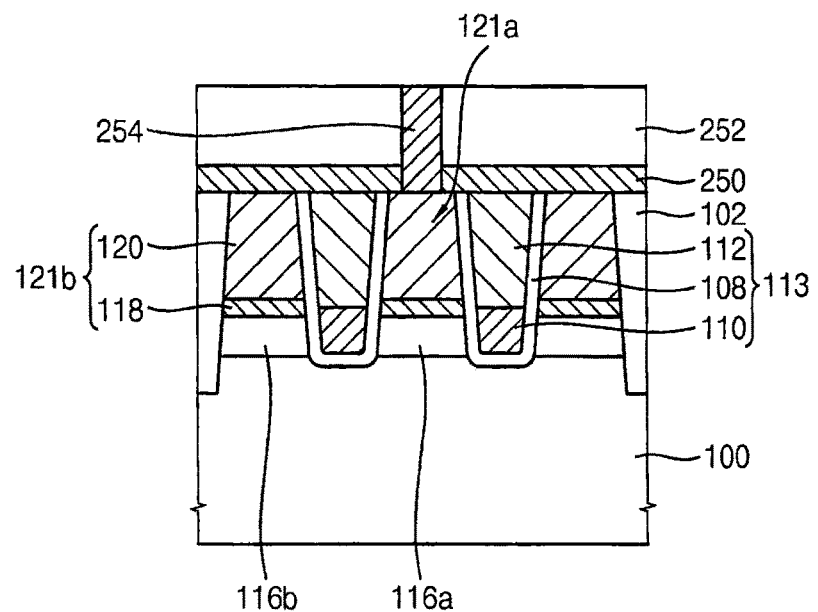
Figure 27:
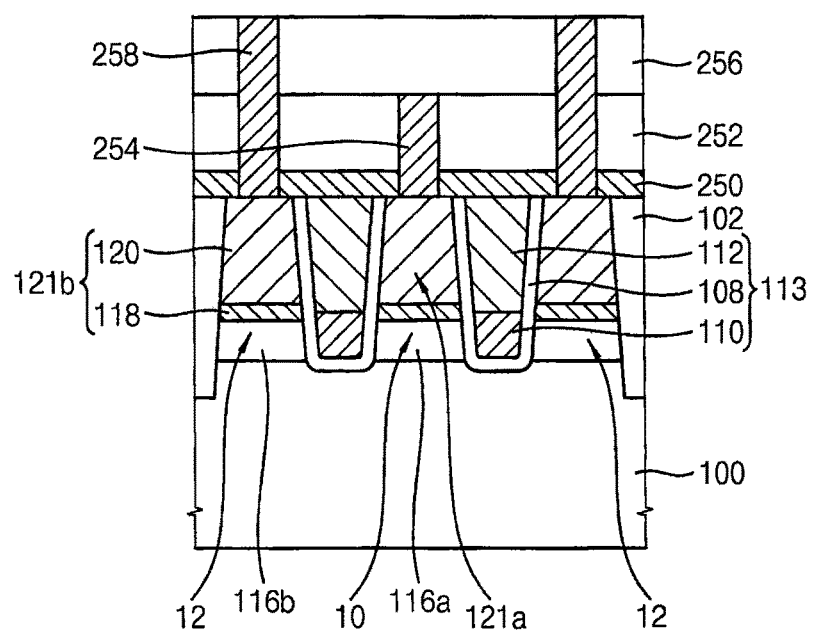

FIGS. 26 and 27 are cross-sections illustrating processing steps in the fabrication of a semiconductor device in FIG. 25 in accordance with some embodiments.

Referring first to FIG. 26, processes substantially the same as or similar to those discussed with reference to FIGS. 3 to 9 may be performed to form a transistor shown in FIG. 9.

An etch stop layer 250 and a first insulating interlayer 252 may be formed on the buried gate structure 113, the first and second buried contact structures 121a and 121b and the isolation layer 102. The etch stop layer 250 may be formed to include a nitride, for example, silicon nitride. The first insulating interlayer 254 may be formed to include an oxide, for example, silicon oxide.

The first insulating interlayer 250 and the etch stop layer 252 may be etched to form an opening (not shown) exposing the first buried contact structure 121a. The opening may extend in the first direction. A first conductive layer may be formed on the first buried contact structure 121a and the first insulating interlayer 252 to fill the opening, and may be planarized until the top surface of the first insulating interlayer 252 may be exposed to form a source line 254 to be electrically connected the first buried contact structure 121a. The source line 254 may include a metal, for example, tungsten (W), titanium (Ti), tantalum (Ta), and the like, or a metal nitride thereof.

Referring to FIG. 27, a second insulating interlayer 256 may be formed on the first insulating interlayer 252 and the source line 254.

The first and second insulating interlayers 252 and 256 and the etch stop layer 250 may be etched to form a contact hole (not shown) exposing the second buried contact structure 121a.

A second conductive layer may be formed on the second buried contact structure 121a and the second insulating interlayer 256 to fill the contact hole. The second conductive layer may include a metal. The second conductive layer may be planarized until the top surface of the second insulating interlayer 256 may be exposed to form a contact plug 258 filling the contact hole. In some embodiments, the planarization process may be performed by the CMP process and/or the etch back process. The contact plug 258 may be formed through the first and second insulating interlayers 124 and 130 and the etch stop layer 122, and may contact the second buried contact structure 121b.

Referring again to FIG. 25, a variable resistance structure 266 may be formed on the contact plug 258. The variable resistance structure 266 may include a lower electrode 260, a variable resistance pattern 262 and an upper electrode 264 sequentially stacked.

In some embodiments, the variable resistance pattern 262 may include a MTJ structure including a fixed layer pattern 262a, a tunnel barrier layer pattern 262b and a free layer pattern 262c.

In some embodiments, the variable resistance pattern 262 may include a material of which a resistance may be changed by oxygen vacancy and/or a migration of oxygen.

In some embodiments, the variable resistance pattern 262 may include a material of which a resistance may be changed by a phase change or a phase transition. In this case, the variable resistance pattern 262 may include a chalcogenide-based material in which germanium (Ge), antimony (Sb) and/or tellurium (Te) are combined by a given ratio.

A third insulating interlayer 268 may be formed to fill a gap between the variable resistance structures 266. The third insulating interlayer 268 may be planarized until the top surface of the variable resistance structures 266 may be exposed The bit line 270 may be formed on the third insulating interlayer 268 and the variable resistance structure 266 to extend in the second direction. The bit line 270 may contact the variable resistance structure 266.

The semiconductor device may include the transistor having high operating currents and charge mobility. Thus, the semiconductor device may have good electrical characteristics.

The above semiconductor device may be applied to various types of memory devices including the transistor.

For example, the transistor may serve as a switching device of memory cells in the memory devices, for example, a magnetic random access memory (MRAM), a phase-change random access memory (PRAM), a resistive random access memory (ReRAM), and the like. Additionally, the semiconductor device may be applied to logic devices such as central processing units (CPUs), main processing units (MPUs), or application processors (APs), and the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising: a substrate defining a gate trench therein;
   a buried gate structure in the gate trench and at least filling the gate trench to a top portion thereof, the buried gate structure including a gate insulation layer pattern, a gate electrode and a capping layer pattern;
   first and second impurity regions in the substrate on opposite sides of the buried gate structure, at least a portion of each of the first and second impurity regions facing a sidewall of the buried gate structure; and
   first and second buried contact structures on the first and second impurity regions, respectively, each of the first and second buried contact structures including a metal silicide pattern and a metal pattern, and at least a portion of each of the first and second buried contact structures facing a sidewall of the buried gate structure; and
   an isolation layer on the substrate, wherein a top surface of the isolation layer is substantially coplanar with top surfaces of the first and second buried contact structures,
   wherein top surfaces of the first and second buried contact structures are substantially coplanar with that of the buried gate structure;
   wherein bottom surfaces of the first and second impurity regions are substantially coplanar with a bottom surface of the gate electrode of the buried gate structure; and
   wherein bottom surfaces of the first and second impurity regions are flat.

2. The semiconductor device of claim 1, wherein the buried gate structure protrudes from a top portion of the gate trench.

3. The semiconductor device of claim 1, wherein top surfaces of the first and second impurity regions are lower than top portions of the gate electrode.

4. The semiconductor device of claim 1, wherein bottoms of the first and second impurity regions are lower than a central portion of the gate electrode corresponding to about ½ of a height of the gate electrode.

5. The semiconductor device of claim 1, wherein the metal silicide pattern directly contacts each of the first and second impurity regions.

6. The semiconductor device of claim 1, wherein a bottom of the metal silicide pattern is lower than a top surface of the gate electrode.

7. The semiconductor device of claim 1, wherein the metal silicide pattern includes at least one selected from the group consisting of cobalt silicide, nickel silicide, titanium silicide, tantalum silicide, molybdenum silicide, and tungsten silicide.

8. A semiconductor device, comprising: a substrate defining a gate trench therein;
a buried gate structure in the gate trench and at least filling the gate trench to a top portion thereof, the buried gate structure including a gate insulation layer pattern, a gate electrode and a capping layer pattern;
first and second impurity regions in the substrate on opposite sides of the buried gate structure, at least a portion of each of the first and second impurity regions facing a sidewall of the buried gate structure;
first and second buried contact structures on the first and second impurity regions, respectively, each of the first and second buried contact structures including a metal silicide pattern and a metal pattern, and at least a portion of each of the first and second buried contact structures facing a sidewall of the buried gate structure; and
a first contact plug on the first buried contact structure; a second contact plug on the second buried contact structure; a bit line electrically connected to the first contact plug; and a capacitor on the second contact plug*
wherein top surfaces of the first and second buried contact structures are substantially coplanar with that of the buried gate structure;
wherein bottom surfaces of the first and second impurity regions are substantially coplanar with a bottom surface of the gate electrode of the buried gate structure; and
wherein bottom surfaces of the first and second impurity regions are flat.

9. The semiconductor device of claim 1, further comprising:
a source line on the first buried contact structure;
a contact plug on the second buried contact structure;
a variable resistance structure electrically connected to the contact plug; and
a bit line on the variable resistance structure.

* * * * *